US006737919B2

(12) United States Patent  (10) Patent No.:  US 6,737,919 B2
Cyrusian  (45) Date of Patent:  May 18, 2004

(54) METHOD AND APPARATUS FOR CALIBRATING A GM CELL UTILIZING A REPLICA GM CELL

(75) Inventor: Sasan Cyrusian, Scotts Valley, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 28 days.

(21) Appl. No.: 09/865,649

(22) Filed: May 25, 2001

(65) Prior Publication Data

US 2002/0175765 A1 Nov. 28, 2002

(51) Int. Cl.[7] ................................ H03F 3/45
(52) U.S. Cl. .................... 330/253; 330/2; 330/258; 330/305; 327/561; 327/563; 327/562
(58) Field of Search .................... 330/2, 253, 258, 330/305; 327/561, 563, 562

(56) References Cited

U.S. PATENT DOCUMENTS

| 4,833,422 A | * | 5/1989 | Atwell | 330/254 |
| 5,384,501 A | * | 1/1995 | Koyama et al. | 330/253 |
| 5,612,648 A | * | 3/1997 | McClellan et al. | 330/253 |
| 6,271,688 B1 | * | 8/2001 | Marchese et al. | 330/253 |

FOREIGN PATENT DOCUMENTS

EP  101174  * 2/1984

OTHER PUBLICATIONS

Chung et al. "A Linear Operational Transconductance Amplifier for Instrumentation Applications," IEEE Transactions on Instrumentation and Measurement vol. 41, Issue 3 Jun. 1992 pp 441–443.*

"Synchronous Recording Channels—PRML & Beyond", rev. 5.61 14.E.18, 1999, published by Knowledge Tek, Inc., Broomfield, Colorado.

"PRML: Seagate Uses Space Age Technology" available on the Internet at http://www.seagate.com/support/kb/disc/prml.html, 2 pages, last accessed Apr. 9, 2001.

"Technologies—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd, 13 pages, last accessed Apr. 9, 2001.

"MR. and PRML: Technologies in Synergy" available at on the Internet at http://www.lionsgate.com/Home/Baden/public_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—Michael B. Shingleton
(74) Attorney, Agent, or Firm—Brinks Hofer Gilson & Lione (57) ABSTRACT

A method and apparatus for calibrating a Gm cell using a Gm replica cell. A digital to analog converter receives a Gm setting code and generates a reference current. The Gm replica cell adjusts the tuning voltage until the difference between a pair of drain currents is substantially equal to the reference current. Where this condition is satisfied, the proper tuning voltage has been acquired. This results in proper calibration for the tuning voltage, which then may be utilized by a Gm cell connected with the Gm replica cell.

18 Claims, 6 Drawing Sheets

METHOD AND APPARATUS FOR CALIBRATING A GM CELL UTILIZING A REPLICA GM CELL

BACKGROUND

A generalized biquad with a programmable boost and natural frequency is often used in continuous time filter applications. In particular, read/write channels for hard drives utilize integrated continuous time filtering on CMOS circuits. The stability of the cut-off frequency and boost of continuous time filters are among characteristics of an integrated filter. One popular method of constructing a generalized biquad is through the use of a Gm-C technique often used for signal processing applications in disk-drive read channels. CMOS Gm-C filters are useful for circuits involving high-frequencies.

The Gm-C technique allows for an in-circuit filter tuning with high speed and low power requirements. Typically, the transconductance is held constant while the capacitance is tuned in the circuit or the capacitance is held constant, while the transconductance is tuned. Often transconductance tuning is preferred due to a larger dynamic range and low distortion. By utilizing transconductance tuning, the corner frequency, $f_c$, and the gain, Q, of the filter can be obtained solely by modifying the transconductance, Gm, of Gm cells in the circuit.

The transconductance is often modified by adjusting a tuning voltage and/or tail current. Transconductance is defined by the following equation:

Eq. 1:

$$Gm = \frac{I}{V},$$

where V is the input voltage and I is the output current of the Gm cell.

With NMOS transistors as Gm setting devices and the tail current held constant, the transconductance increases as the tuning voltage is increased. Similarly, the transconductance decreases as tuning voltage is decreased. For NMOS with the voltage held constant, the transconductance increases as the tail current is increases and the transconductance decreases as the tail current decreases.

Operation of a biquad, or other circuit in which Gm cells are utilized, is also affected by environmental factors, such as temperature, and manufacturing process tolerances. In order to account for these factors, proportional-to-absolute temperature current sources (PTAT sources) are often used. With PTAT techniques, a thermometer is embedded in a chip and the current sent to the Gm setting device(s) is delivered with respect to absolute temperature, i.e. a Kelvin based measurement, thereby adjusting the transconductance. This solution is problematic because the temperature dependency of the transconductance is not necessarily linear. Moreover, an exact mathematical representation of the effect of temperature on the transconductance is often not known.

The PTAT approach suffers from large variations against changes of environmental temperature and often requires an increase in a power supply voltage above the safe upper limit of the process. Additionally, the circuit is sensitive to noise in the substrate or other circuits.

SUMMARY

Tunable Gm cells may be used to provide filtering and gain adjustments. Often these tunable Gm cells are used in a biquad, a second order filter. The transfer function is dependent on the transconductance (Gm) of the tunable Gm cells. Gm cells are often tuned by adjusting a tuning voltage. This process is known as tuning.

Replica cells can calibrate the Gm cells by providing the Gm cells with the correct tuning voltage. Additionally, the replica cells may be used to provide the Gm cells with a bias voltage.

In one aspect, a Gm replica cell is operable to receive a Gm setting code and provide a tuning voltage to a Gm cell. Here, the tuning voltage is adjusted until the difference between two drain currents passing through the input transistors are equal to a current reference. When this relationship is achieved the transconductance of the replica cell, and the Gm cell to which it is connected, is equal to the positive output current reference divided by the difference between the high voltage reference and a low voltage reference. Under these conditions, the transconductance of the cell is calibrated.

The features of the preferred embodiments of the present invention are further described in the detailed description section below.

DETAILED DESCRIPTION OF THE PRESENTLY PREFERRED EMBODIMENTS

The embodiments described herein relate to a method and apparatus for calibrating a Gm cell utilizing a replica Gm cell. Herein, the phrase "connected with" is defined to mean directly connected to or indirectly connected with through one or more intermediate components. Such intermediate components may include both hardware and software based components. The present application has been filed currently with U.S. patent application Ser. No. 09/865,863, filed on May 25, 2001, now U.S. Pat. No. 6,420,064 and titled, "METHOD AND APPARATUS FOR AN EFFICIENT LOW VOLTAGE SWITCHABLE GM CELL," the entire disclosure of which is incorporated herein by reference.

The preferred embodiments of the present invention may be designed for use with either a conventional Gm cell, a Gm cell disclosed in the above referenced co-pending application, or other Gm cells. A replica cell substantially matches the electrical properties of the Gm cell that it calibrates. In particular, the Gm setting devices and the input transistors of the replica cell are matched with those of the Gm cell. Further, if used, cascode transistors connected with the input transistors may also be matched. A replica scenario also exists if the tail current and the channel width of the transistors in the signal path are scaled with the same factor. For example, the channel width of the transistors in the replica cell may be one-quarter of the channel width of the transistors of the Gm cells in the signal path if the tail current of the replica Gm cell is one-quarter of the tail current of the Gm cells in the signal path. In this example, the pull-up current sources need not match.

Figure 1:
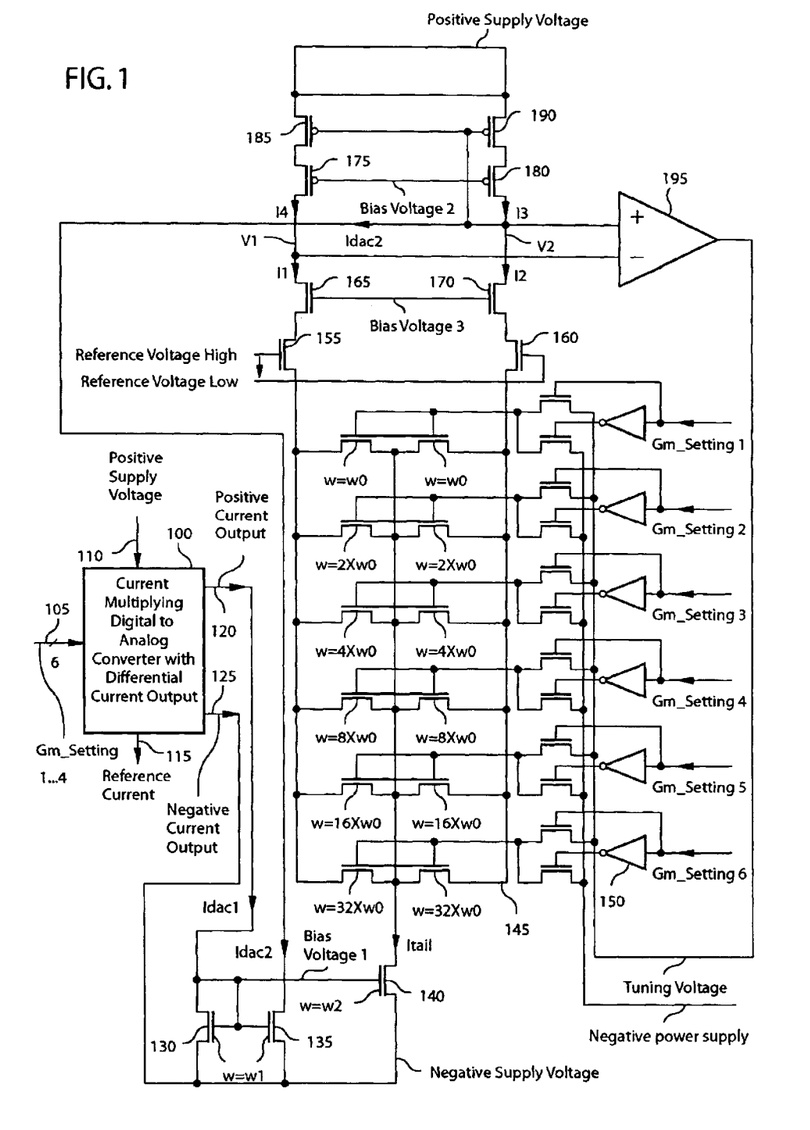
FIG. 1 depicts a circuit diagram for one embodiment of a Gm replica cell.
Figure 2:
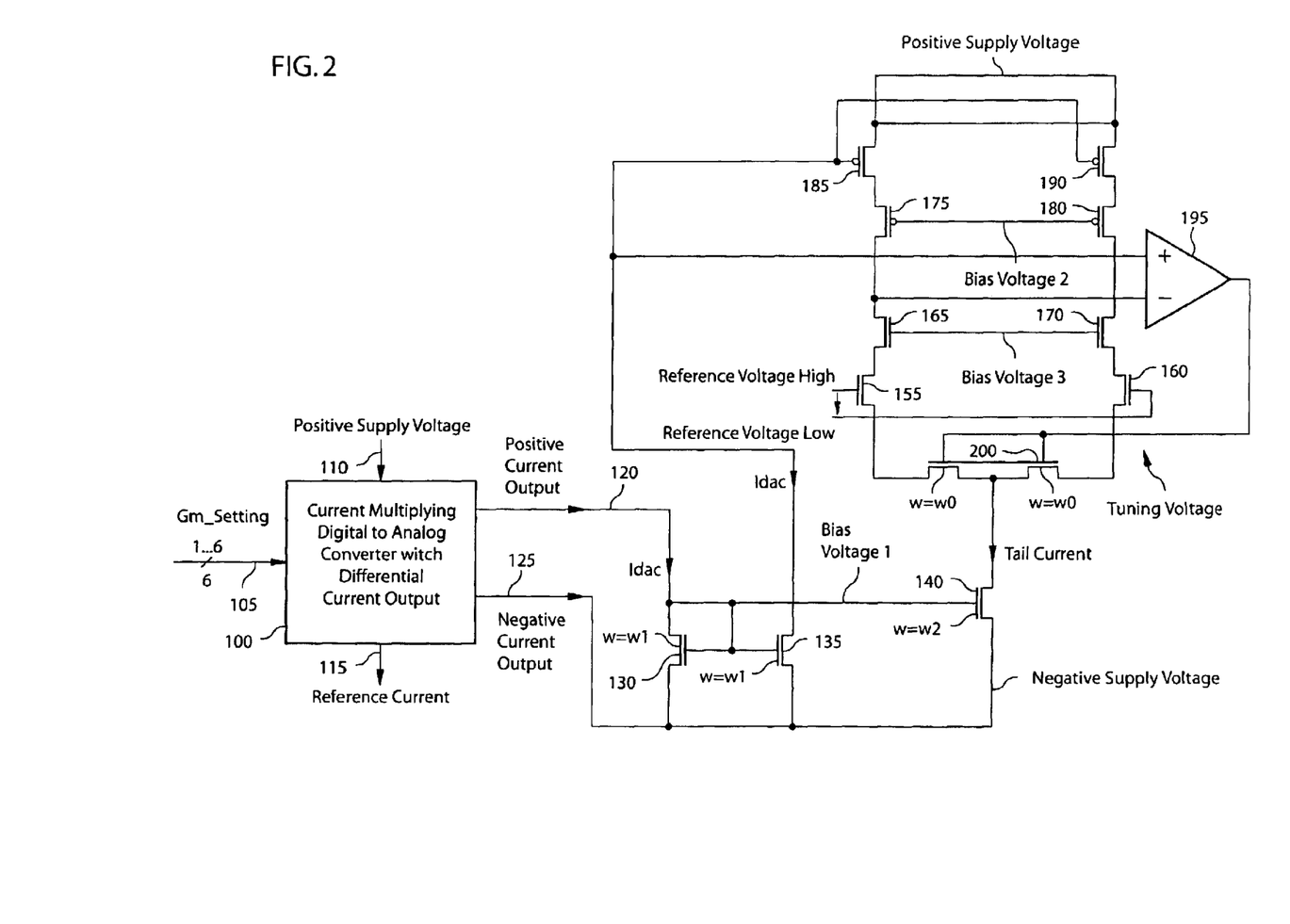
FIG. 2 depicts a circuit diagram for another embodiment of a Gm replica cell.

FIG. 1 depicts a circuit diagram for a replica cell designed for use the switchable Gm cell of U.S. patent application Ser. No. 09-865,863, filed on May 25, 2001, now U.S. Pat. No. 6,480,064 and titled, "METHOD AND APPARATUS FOR AN EFFICIENT LOW VOLTAGE SWITCHABLE GM CELL." FIG. 2 depicts a circuit diagram for a replica cell designed for use with a conventional Gm cell. Where the elements described are the same, like numbers have been utilized.

In FIG. 1, a current multiplying digital-to-analog converter 100 with differential current output is provided. The digital-to-analog converter 100 has inputs for a Gm setting code 105 and connects with a positive supply voltage 110 and a reference current 115. The digital-to-analog converter 100 has outputs for positive current 120 and negative current 125. The digital-to-analog converter 100 generates a stable current, $I_{dac1}$, that is proportional to the value of the digital code received by the Gm setting code input 105 and the reference current 115.

Figure 4:
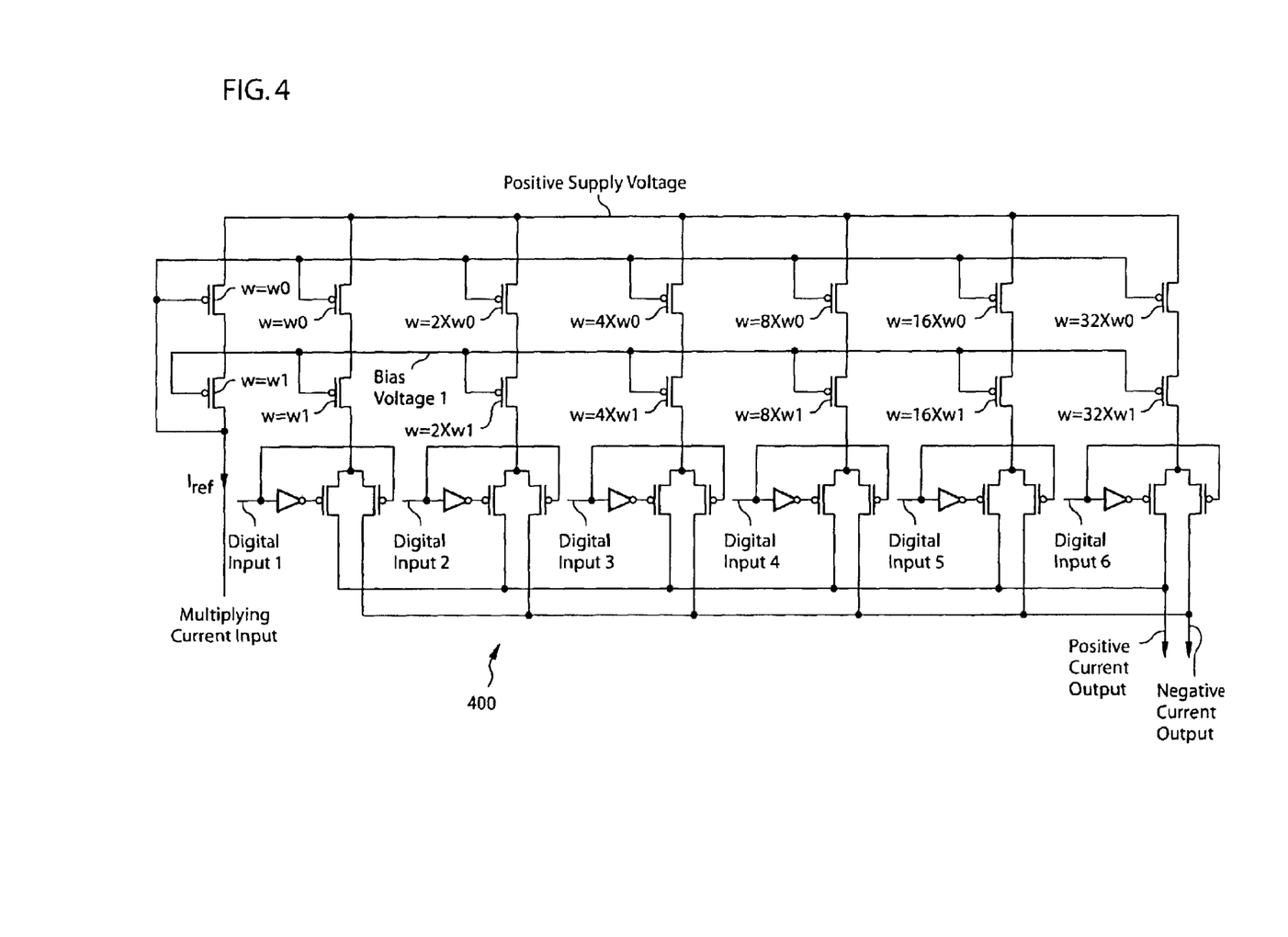
FIG. 4 depicts one embodiment of a circuit for a multiplying current output digital to analog converter.
Figure 5:
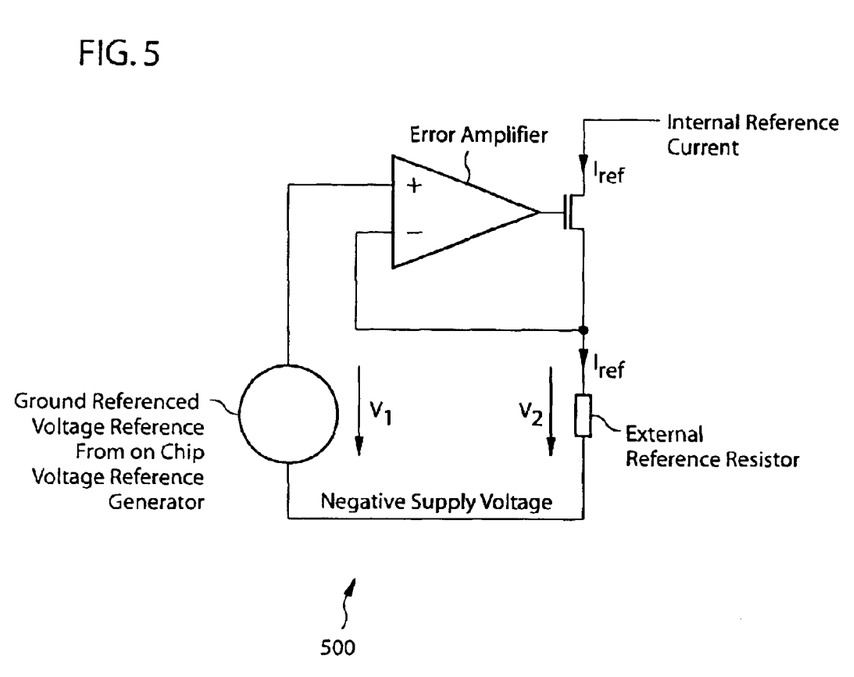
FIG. 5 depicts one embodiment of a circuit for a stable reference current generator.

An exemplary multiplying current output digital-to-analog converter 400 is depicted in FIG. 4. An exemplary circuit for the generation of a highly accurate and stable reference current using an external reference resistor with only one chip-pin is depicted in FIG. 5. Other circuit designs may also be used. For example, the circuit of FIG. 4 may be implemented with internal reference resistors.

Referring back to FIG. 1, positive current output 120 is connected with the drain and gates of a current mirror first transistor 130, the gate of a current mirror second transistor 135, and the gate of a tail current transistor 140. Current mirror first transistor 130 and current mirror second transistor 135 operate as a current mirror in which $I_{dac1}=I_{dac2}$. In another embodiment, $I_{dac2}$ may also be designed to be an arbitrary multiple of $I_{dac1}$ This may be accomplished by altering the ratio of channel widths of the transistors 130 and 135.

The tail current transistor 140, in conjunction with current mirror first transistor 130, also operates as a current mirror and generates $I_{tail}$. In a preferred embodiment, the tail current transistor 140 is constructed with a channel width that is greater than the channel width of the current mirror first transistor 135 or the current mirror second transistor 140. The channel width is a matter of design preference. In FIG. 1, channel width $w_2$, is greater than channel width $w_1$, because there are more devices driven by the tail current.

In the embodiment of FIG. 1, the Gm setting code 105 consists of bits of a binary word. In an embodiment for use with the switchable Gm cell disclosed in U.S. patent application Ser. No. 09-865,863, filed on May 25, 2001 now U.S. Pat. No. 6,480,064, assigned and titled, "METHOD AND APPARATUS FOR AN EFFICIENT LOW VOLTAGE SWITCHABLE GM CELL," the Gm setting code 105 also determines which of the Gm setting devices 145 (shown here in a binary coding arrangement) are turned on. Because the tail current, $I_{tail}$, is dependent on $I_{dac1}$, which is dependent on the Gm setting code 105, the voltage drop across the Gm setting devices 145 will remain constant. For example, if an original Gm setting code of 3 is doubled to 6, $I_{dac1}$, and $I_{tail}$ both double. At the same time, the switching circuit 150 (shown here without a decoding circuit) receives the Gm setting code 105 and will turn on the appropriate Gm setting devices in order to double the overall transconductance of the Gm setting devices 145. In this example, where Gm setting devices 1 and 2 were formerly turned on for a code of 3, the change to 6 results in Gm setting devices 2 and 3 turned on and the rest turned off. Here, the transconductance of the Gm setting devices, as a whole, doubles at the same time as the doubling of the tail current. Consequently, the voltage drop across the Gm setting devices remains constant. Thus, the operation of the rest of the replica cell is not affected and the process of determining a proper tuning voltage is enhanced. In other embodiments, such as the embodiment shown in FIG. 2, the tuning voltage accounts for the change in the transconductance of the Gm cell. In another embodiment, the tail current may be held constant. Here, the voltage drop across the Gm setting devices will change by reducing the Gm.

The Gm setting devices 145 are connected with a first input transistor 155 and a second input transistor 160. The first input transistor 155 is connected with a high reference voltage. The second input transistor 160 is connected with a low reference voltage. Since the values of these two voltages are not the same, currents $I_1$ and $I_2$ will have different magnitudes. The input transistors 155 and 160 are connected with cascode transistors 165 and 170. Cascode transistors 165 and 170 are connected with cascode transistors 175 and 180. Cascode transistors 175 and 180 are connected with a mirrored pull-up current source 185 and a mirror reference transistor 190.

The gates of the mirrored pull-up current source 185 and a mirror reference transistor 190 are connected with the drain of current mirror second transistor 135, the drain of the cascode transistor 180, the drain of the cascode transistor 170, and the positive input of the error amplifier 195. The drains of the cascode transistors 165 and 175 are respectively connected with the two inputs of an error amplifier 195. The mirrored pull-up current source 185, mirror reference transistor 190, and casode transistors 175 and 180 comprise a current mirror that configures the replica cell as a single-ended amplifier, instead of a differential amplifier.

One input of the error amplifier 195 is connected with the drain of the cascode transistor 175 and the other is connected with the drain of cascode transistor 180. The error amplifier 195 outputs the difference between the drain voltages, $V_1$ and $V_2$, multiplied by a gain, and supplies a tuning voltage to the Gm setting devices. The gain utilized by the error amplifier 195 is often in the range of 20 dB and 100 dB. Numerous different circuit designs for the operation of the error amplifier 195 may be used.

The replica cell insures that the transconductance, Gm, is equal to the positive output current, $I_{dac1}$, divided by the difference between the high reference voltage, $V_{refH}$, and the low reference voltage, $V_{refL}$. Thus, the following relationship is desired:

Eq. 2:

$$Gm = \frac{I_{dac1}}{V_{refH} - V_{refL}}$$

If this equation is satisfied, the transconductance of the GM cell is properly set. The error amplifier 195, in accordance with the design of the replica cell, adjusts the tuning voltage until this condition is met.

Because the current mirror first transistor 130 and current mirror second transistor 135 have the same characteristics, namely substantially the same channel width and channel length, $$I_{dac1}=I_{dac2} \qquad \text{Eq.3}$$

Similarly, because of the difference in the channel width between tail current source 140 and the current mirror first transistor 130, Eq. 4:
$$I_{tail} = \left(\frac{w_2}{w_1}\right) I_{dac1}$$

Additionally, under ideal circumstances, the following equations are applicable:

$$I_3 = I_{dac2} + I_2 \quad \text{Eq.5}$$

$$I_4 = I_3 \quad \text{Eq.6}$$

$$I_1 - I_2 = (V_{refH} - V_{refL})\text{Gm} \quad \text{Eq.7}$$

$$I_1 = I_4 \quad \text{Eq.8}$$

By combining equations 5, 6, and 8, the following equation results:

$$I_1 - I_2 = I_{dac2} \quad \text{Eq.9}$$

Equation 9 represents the condition in which the Gm cell is properly tuned. If $I_1 - I_2 < I_{dac2}$, the transconductance, Gm, of the Gm cell is too low. Under this condition, error amplifier 195 yields a lower tuning voltage. Similarly, if $I_1 - I_2 > I_{dac2}$, the transconductance of the Gm cell is too high. Here, the error amplifier 195 yields a higher tuning voltage.

In the preferred embodiment of FIG. 1, the following dimensions may be utilized:

Positive Output Current $I_{dac1}$: Gm Setting * 2.5 $\mu$A
Current Mirror First and Second Transistors 130, 135: W=36 $\mu$m, L=0.36 $\mu$m
Tail current source 140: W=36 $\mu$m, L=0.36 $\mu$m
Gm Setting Devices 145: W=0.4 $\mu$m, L=0.4 $\mu$m
Input transistors 155, 160: W=100 $\mu$m, L=0.18 $\mu$m
NMOS cascode transistors 165, 170: W=100 $\mu$m, L=0.18 $\mu$m
PMOS cascode transistors 175, 180: W=360 $\mu$m, L=0.18 $\mu$m
Mirror Pull-up Current Source 185: W=36 $\mu$m, L=0.36 $\mu$m
Mirror Reference Transistor 190: W=36 $\mu$m, L=0.36 $\mu$m For certain applications, it may also be desirable to use a higher resolution in the digital-to-analog converter. For example, another embodiment of the replica cell may be accomplished by using a 10-bit Gm setting code 105. At the same time, this embodiment may continue to use six pairs of Gm setting devices and six Gm setting controls. Here, the first six most significant bits of the digital-to-analog converter 100 are connected to the six Gm setting controls. The remaining 4 least significant bits may be used to change the positive output current, $I_{dac1}$. By adjusting the output current, variations in manufacturing process, temperature, and power supply voltage may be additionally compensated by the digital-to-analog converter 100.

Referring now to FIG. 2, this embodiment is designed for use with a conventional Gm cell. In this embodiment, the Gm setting controls 150 are not utilized.

In FIG. 2, a current multiplying digital-to-analog converter 100 with differential current output is provided. The digital-to-analog converter 100 has inputs for a Gm setting code 105 and connects with a positive supply voltage 110 and a reference current 115. The digital-to-analog converter 100 has outputs for positive current 120 and negative current 125. The digital-to-analog converter 100 generates a stable current, $I_{dac1}$, that is proportional to the value of the digital code received by the Gm setting code input 105 and the reference current 115.

A positive current output 120 is connected with the drain and gates of a current mirror first transistor 130, the gate of a current mirror second transistor 135, and the gate of a tail current transistor 140. Current mirror second transistor 135 generates $I_{dac2}$. The tail current transistor 140 generates $I_{tail}$.

The Gm setting devices 200 are connected with a first input transistor 155 and a second input transistor 160. The first input transistor 155 is connected with a high reference voltage. The second input transistor 160 is connected with a low reference voltage. The input transistors 155 and 160 are connected with cascode transistors 165 and 170. Cascode transistors 165 and 170 are connected with cascode transistors 175 and 180. Cascode transistors 175 and 180 are connected with a mirrored pull-up current source 185 and a mirror reference transistor 190.

The gates of the mirrored pull-up current source 185 and a mirror reference transistor 190 are connected with the drain of current mirror second transistor 135, the drain of the cascode transistor 180, the drain of the cascode transistor 170, and the positive input of the error amplifier 195. The drains of the cascode transistors 165 and 175 are respectively connected with the two inputs of an error amplifier 195.

One input of the error amplifier 195 is connected with the drain of the cascode transistor 175 and the other is connected with the drain of cascode transistor 180. The error amplifier 195 outputs the difference between the drain voltages, $V_1$ and $V_2$, multiplied by a gain, and supplies a tuning voltage to the Gm setting devices. As one of ordinary skill in the art would recognize, numerous types of Gm cells and Gm setting devices may be utilized in accordance with the present invention.

Further, the Gm replica cells depicted in FIGS. 1 and 2 may also be modified in accordance with the present invention. For example, instead of utilizing a current mirror comprised of the mirrored pull-up current source 185, mirror reference transistor 190, and casode transistors 175 and 180, a common mode feedback loop may be utilized. An example of a common mode feeback loop is depicted in FIG. 8 of U.S. patent application Ser. No. 09-865,863, filed on May 25, 2001 now U.S. Pat. No. 6,480,064, and titled, "METHOD AND APPARATUS FOR AN EFFICIENT LOW VOLTAGE SWITCHABLE GM CELL," by the arrangement of current sources 102 and 104, cascode transistors 106 and 108, and error amplifier 830. A similar arrangement may be used in a replica Gm cell.

Figure 3:
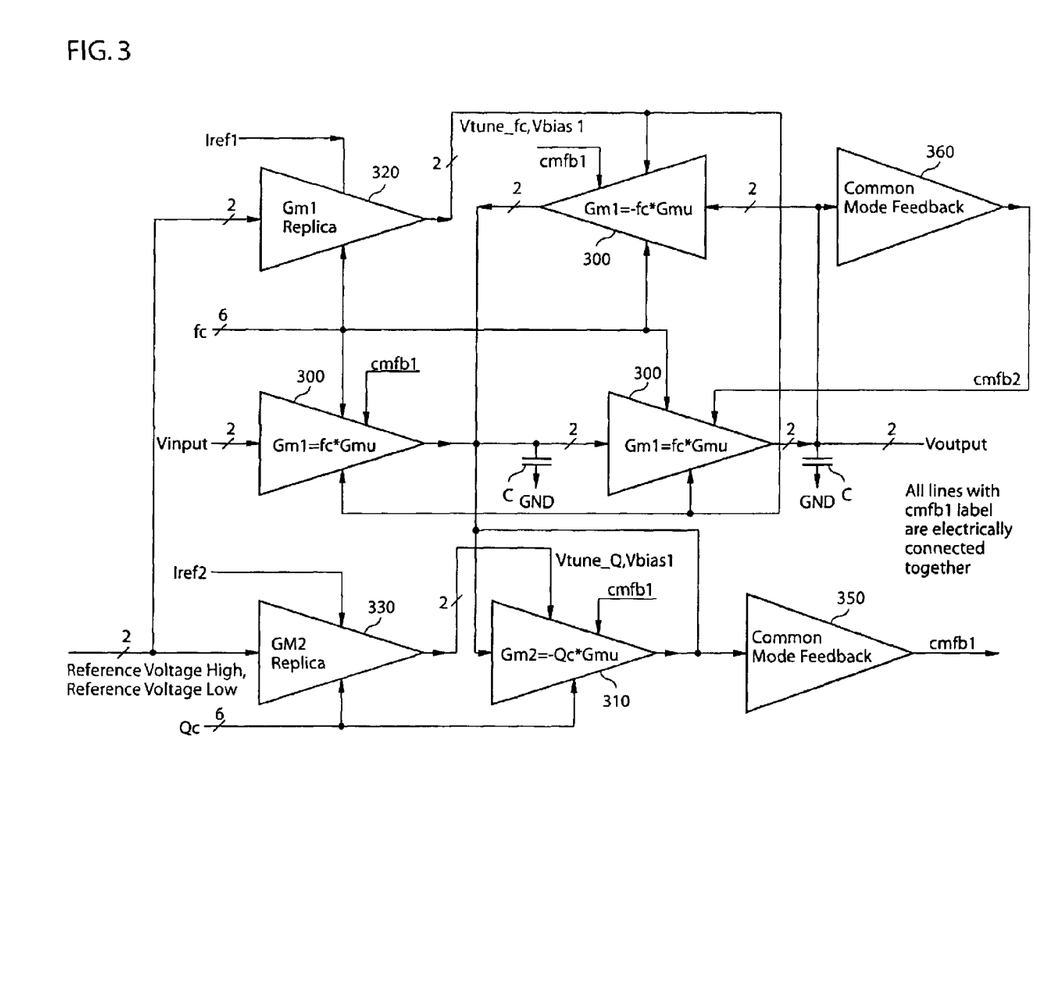
FIG. 3 depicts one embodiment of generalized biquad stage that utilizes Gm replica cells.

The replica Gm cell may be used in a variety of applications. FIG. 3 depicts an embodiment in which a generalized biquad stage has a digitally programmable boost (Q) and natural frequency (fc) that uses 6 bit binary digital codes. In this embodiment, a pair of Gm replica cells are used to calibrate the Gm cells 320, 330 that implement a second order filter represented by the following transfer function:

Eq. 10:
$$H(s) = \frac{1}{1 + \frac{s}{\omega_0 Q} + \frac{s^2}{\omega_0^2}}$$

where natural frequency $$\omega_0 = \frac{Gm_1}{C} = f_c \frac{Gm_u}{C} \text{ and peaking factor } Q = \frac{Gm_1}{Gm_2} = \frac{f_c}{Q_c},$$

and $f_c$ and $Q_c$ are binary coded digital numbers.

In this embodiment, there are three $Gm_1$ cells 300 and one $Gm_2$ cell 310. Gm1 replica cell 320 and Gm replica cell 330 are used to calibrate the Gm1 cells 300 and Gm2 cell 310 respectively. The Gm replica cells 320 and 330 supply the Gm cells 300 and 310 with a tuning voltage and a bias voltage. In the circuit configuration of FIG. 3, the altering of $Gm_1$ and $Gm_2$ may be used to adjust the natural frequency and/or the boost of the transfer function realized.

As one skilled in the art would appreciate, for operation in the signal path, several different types of Gm cells may be utilized. For example, Gm replica cells may be designed for use with the circuits depicted in FIGS. 1, 2, 8, 9, and 10 of U.S. patent application Ser. No. 09-865,863, filed on May 25, 2001 now U.S. Pat. No. 6,480,064, and titled, "METHOD AND APPARATUS FOR AN EFFICIENT LOW VOLTAGE SWITCHABLE GM CELL." Further, the replica Gm cells may incorporate the use of the Gm setting devices depicted in FIGS. 3 and 4 of U.S. patent application Ser. No. 09-865,863, filed on May 25, 2001 now U.S. Pat. No. 6,480,064, and titled, "METHOD AND APPARATUS FOR AN EFFICIENT LOW VOLTAGE SWITCHABLE GM CELL," conventional Gm setting devices, or other Gm setting devices.

Figure 6:
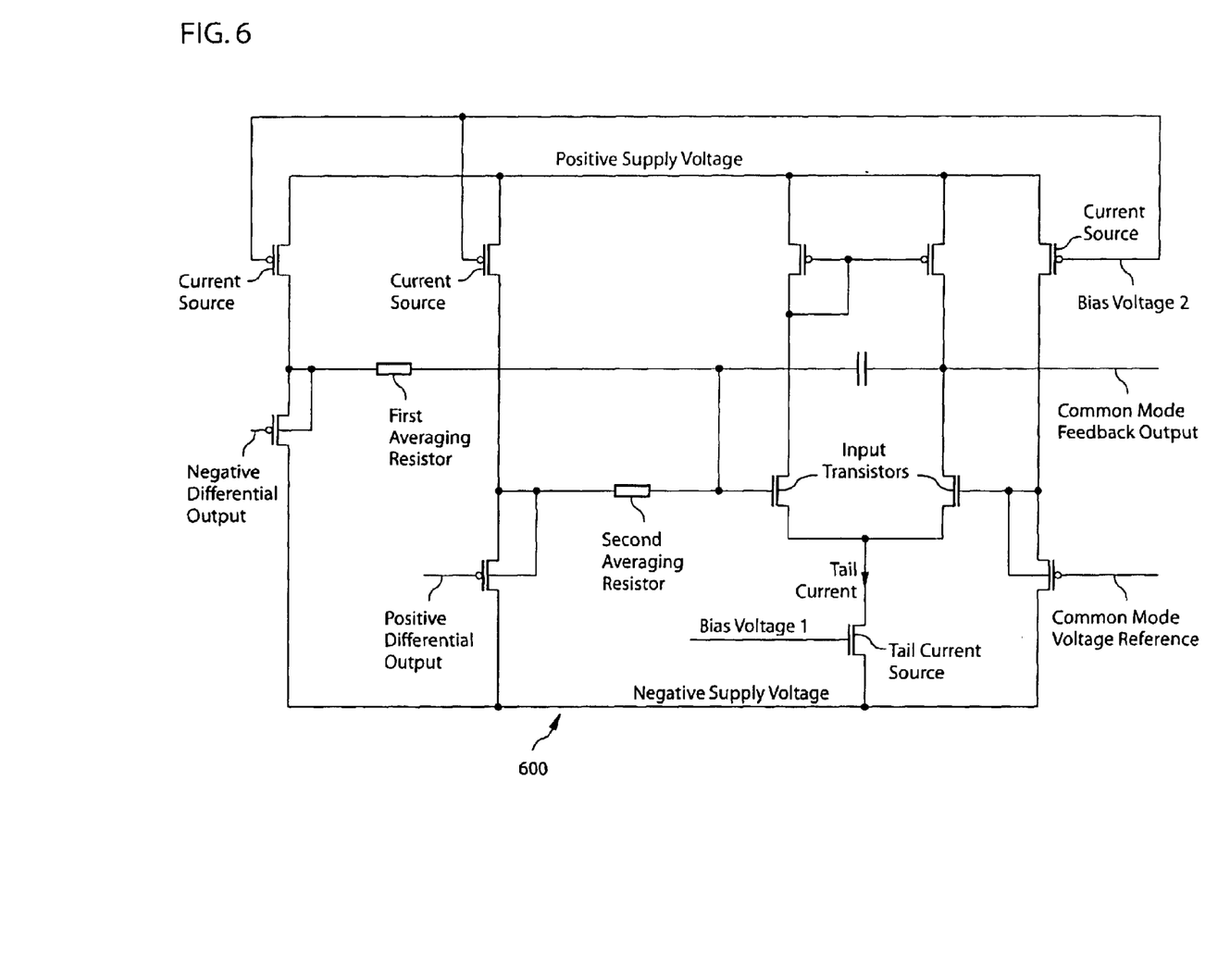
FIG. 6 depicts one embodiment of a circuit for a common mode feedback circuit.

Additionally, in FIG. 3, common mode feedback circuits 340 and 350 are connected with the $Gm_1$ cells 300 and $Gm_2$ cell 310 respectively to ensure that the proper pull-up current is provided to them and the common mode output voltage is stable. An exemplary circuit for a the common mode feedback circuits 340 and 350 is depicted in FIG. 6.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

I claim:

1. a replica Gm cell comprising:
    at least one Gm setting device;
    a pair of input transistors connected with said Gm setting device, each input transistor operable to receive a reference voltage;
    an error amplifier connected with said pair of input transistors;
    a reference current source connected with said error amplifier; and
    a current mirror connected with said error amplifier.

2. The replica Gm cell of claim 1 wherein said at least one Gm setting device comprises a pair of transistors, said transistors having gates that are tied together.

3. The replica Gm cell of claim 1 wherein said at least one Gm setting device comprises a plurality of transistors, said transistors having sources that are tied together and drains that are tied together.

4. The replica Gm cell of claim 1 wherein said at least one Gm setting device is arranged in a binary coded configuration.

5. The replica Gm cell of claim 1 wherein said at least one Gm setting device is arranged in a thermometer coding configuration.

6. The replica Gm cell of claim 1 wherein said at least one Gm setting device is arranged in a segmented thermometer coding configuration.

7. The replica Gm cell of claim 1 wherein each of said input transistors are operable to receive a reference voltage.

8. The replica Gm cell of claim 1 wherein said reference current source comprises a current multiplying digital-to-analog converter.

9. The replica Gm cell of claim 1 wherein said reference current source comprises a current multiplying digital to analog converter and a current mirror.

10. The replica Gm cell of claim 1 further comprising a tail current source connected with said reference current source.

11. The replica Gm cell of claim 1 wherein said current mirror comprises:
    a mirror reference transistor, said mirror reference transistor having a gate, source, and drain connected with a first input of said error amplifier; and
    a mirrored pull-up current source, said mirrored pull-up current source having a gate connected with said gate of said mirror reference transistor and said first input of said error amplifier, a source connected with said source of said mirror reference transistor, and a drain connected with a second input of said error amplifier.

12. The replica Gm cell of claim 1 wherein said current mirror comprises:
    a mirror reference transistor, said mirror reference transistor having a gate, a source, and a drain;
    a first cascade transistor, said first cascode transistor having a gate, a source connected with the drain of said mirror reference transistor, and a drain connected with a first input of said error amplifier;
    a mirrored pull-up current source, said mirrored pull-up current source having a gate connected with said gate of said mirror reference transistor and said first input of said error amplifier, a source connected with said source of said mirror reference transistor, and a drain;
    a second cascade transistor, said second cascade transistor having a gate connected with said gate of said first cascade transistor, a source connected with the drain of said mirrored pull-up current source, and a drain connected with a second input of said error amplifier.

13. a replica Gm cell comprising:
    a digital to analog converter, said digital to analog converter operable to receive a Gm setting code and output a current having a magnitude proportional to said Gm setting code;
    a current mirror connected with said digital-to-analog converter;
    a mirror reference transistor connected with said current mirror;
    a mirrored pull-up current source connected with said current mirror and said mirror reference transistor;
    a tail current source connected with said digital to analog converter;
    at least one Gm setting device connected with said tail current source;
    a first input transistor connected with said at least one Gm setting device;
    a second input transistor connected with said at least one Gm setting device; and
    an error amplifier operable to provide a tuning voltage to said Gm setting device, said error amplifier having a first input and a second input,
    wherein said error amplifier generates said tuning voltage by comparing a first voltage located between said first input transistor and said mirrored pull-up current source with a second voltage located between said second input transistor and said mirror reference transistor.

14. The replica Gm cell of claim 13 further comprising a first cascode transistor connected with said mirrored pull-up current source and said first input of said error amplifier and second cascade transistor connected with said mirror reference transistor and said second input or said error amplifier.

15. The replica Gm cell of claim 13 further comprising a first cascode transistor connected with said first input transistor and said error amplifier and a second cascade transistor connected with said second input transistor and said error amplifier.

16. The replica Gm cell of claim 13 wherein said at least one Gm setting device comprises a plurality of Gm setting devices, each of said Gm setting devices comprising at least one transistor with a source, gate, and drain and said plurality of Gm setting devices having said sources tied together and said drains tied together.

17. The replica Gm cell of claim 16 further comprising a switching circuit connected with said plurality of Gm setting devices and operable to receive said Gm setting code and provide a voltage to said gates of said Gm setting devices.

18. The replica Gm cell of claim 16 wherein said digital to analog converter is operable to receive a Gm setting code having a number of bits greater than a number of Gm setting devices.

* * * * *

UNITED STATES PATENT AND TRADEMARK OFFICE
CERTIFICATE OF CORRECTION

PATENT NO. : 6,737,919 B2
DATED : May 18, 2004
INVENTOR(S) : Sasan Cyrusian

It is certified that error appears in the above-identified patent and that said Letters Patent is hereby corrected as shown below:

Column 8,
Line 23, after "a first" delete "cascade" and substitute -- cascode -- in its place.
Line 32, after "a second" delete "cascade" and substitute -- cascode -- in its place.

Column 9,
Line 2, after "second" delete "cascade" and substitute -- cascode -- in its place.
Line 6, after "a second" delete "cascade" and substitute -- cascode -- in its place.

Signed and Sealed this

Fourth Day of October, 2005

JON W. DUDAS
*Director of the United States Patent and Trademark Office*